United States Patent [19]

Glance

[11] Patent Number: 4,574,254
[45] Date of Patent: Mar. 4, 1986

[54] PHASE-LOCK LOOP CIRCUIT PROVIDING VERY FAST ACQUISITION TIME

[75] Inventor: Bernard Glance, Colts Neck, N.J.

[73] Assignee: AT&T Bell Laboratories, Murray Hill, N.J.

[21] Appl. No.: 648,241

[22] Filed: Sep. 7, 1984

Related U.S. Application Data

[63] Continuation-in-part of Ser. No. 613,421, May 24, 1984, abandoned.

[51] Int. Cl.$^4$ ............................................. H03L 7/00
[52] U.S. Cl. ...................................... 331/17; 331/16; 331/25
[58] Field of Search ................... 331/1 R, 1 A, 16, 17, 331/25

[56] References Cited

U.S. PATENT DOCUMENTS

| | | | |
|---|---|---|---|
| 3,699,454 | 10/1972 | Hudspeth et al. | 455/208 |
| 3,795,870 | 3/1974 | Sanders | 331/1 |
| 3,993,958 | 11/1976 | Cutsogeorge | 328/109 |
| 4,099,137 | 7/1978 | Alm, Jr. et al. | 331/16 |
| 4,103,250 | 7/1978 | Jackson | 331/1 |
| 4,219,783 | 8/1980 | Carter et al. | 331/1 |
| 4,297,650 | 10/1981 | Shinmyo | 331/17 X |
| 4,363,004 | 12/1982 | Englund, Jr. et al. | 331/8 |
| 4,379,270 | 4/1983 | Carter et al. | 331/1 |
| 4,387,348 | 6/1983 | Fritze | 331/17 |
| 4,514,705 | 4/1985 | Harzer | 331/17 X |

FOREIGN PATENT DOCUMENTS

2084415 4/1982 United Kingdom .................. 331/17

OTHER PUBLICATIONS

D. Richman, "The DC Quadricorrelator: A Two-Mode Synchronization System", *Proc. IRE*, vol. 42, No. 1, Jan. 1954, pp. 288-299.
Henry, "Frequency-Agile Millimeter-Wave Phase Lock System", *Rev. Sci. Instrum.*, vol. 47, No. 9, Sep. 1976, pp. 1020-1025.
Spilker, Digital Communications by Satellite, Prentice-Hall, 1977, pp. 359-362.

*Primary Examiner*—Eugene R. LaRoche
*Assistant Examiner*—R. Pascal
*Attorney, Agent, or Firm*—Erwin W. Pfeifle

[57] ABSTRACT

The present invention relates to a very fast acquisition phase-lock loop arrangement comprising means for generating an error signal between an input signal to the loop and an output signal of a voltage controlled oscillator (VCO). The generated error signal, over its possible range of phase differences, is transformed by a transforming means into an output signal comprising a predetermined nonlinear response. The output signal from the transforming means is integrated in an integrating means to generate a control signal for appropriately changing the output signal of the VCO. Noise performance can be significantly improved by cascading two or more of the present phase-lock loop arrangements.

10 Claims, 5 Drawing Figures

4,574,254

PHASE-LOCK LOOP CIRCUIT PROVIDING VERY FAST ACQUISITION TIME

CROSS-REFERENCE TO RELATED APPLICATION

This application is a continuation-in-part of application Ser. No. 613,421 filed May 24, 1984, now abandoned.

TECHNICAL FIELD

The present invention relates to a very fast acquisition phase-lock loop arrangement and, more particularly, to a very fast acquisition second-order phase-lock loop arrangement comprising means for providing an error signal between an input signal to the loop and a voltage controlled oscillator (VCO) output signal; a network arrangement, responsive to signals from the error signal means, including a pair of diodes in a parallel front-to-back arrangement shunted by a resistance of a predetermined value, which combination feeds an operational amplifier (OP-AMP); and an integrator for integrating the output signal from the OP-AMP of the network arrangement and delivering the resultant signal to the input of the VCO.

DESCRIPTION OF THE PRIOR ART

The acquisition time of a second-order phase-lock loop can be prohibitively long when the initial frequency offset is large compared to the loop's natural frequency. Different techniques have been proposed to accelerate the acquisition time of such phase-lock loops. One currently utilized technique uses a ramp-shaped waveform to sweep the frequency of a voltage-controlled oscillator (VCO) as disclosed in, for example, the book "Digital Communications by Satellite" by J. J. Spilker, Prentice Hall, 1977, in Chapter 12 at pages 359–362. Two other less frequently used methods are the combined discriminator-phase detector scheme as disclosed, for example, in the article "Frequency-Agile Millimeter-Wave Phase Lock System" by P. S. Henry in *Review Scientific Instruments*, Vol. 47, No. 9, September 1976 at pages 1020–1025, and the dual-time-constant switching technique as disclosed, for example, in the article "The DC Quadricorrelator: A Two-Mode Synchronization System" by D. Richman in *Proceedings of the I.R.E.*, Vol. 42, No. 1, January 1954 at pages 288–299.

Other arrangements have been disclosed for providing fast acquisition for a phased-lock loop. One such arrangement is disclosed in U.S. Pat. No. 3,933,958 issued to G. A. Cutsogeorge on Nov. 23, 1976. There the phase-lock loop utilizes a plurality of R-C circuits, having different time constants, interconnected with diodes. Another arrangement is disclosed in U.S. Pat. No. 3,795,870 issued to S. N. Sanders on Mar. 5, 1974 where a frequency-phase detector operating in the frequency detector mode produces a high level dc control signal to a VCO to rapidly lock the loop. At loop lock, the frequency-phase detector switches to its phase detector mode for normal phase-lock loop operation. Still another arrangement is disclosed in U.S. Pat. No. 4,379,270 issued to M. P. Carter et al on Apr. 5, 1983 wherein a fixed oscillator feeds a reference frequency to a phase comparator via a fixed divider, while a VCO feeds its output frequency to the comparator via an adjustable divider. In response to a phase error, the comparator produces a control signal which is integrated to adjust the VCO frequency and has a value to change the VCO frequency to produce a temporary phase error in the opposite direction to the detected phase error.

The problem in the prior art is to provide a phase-lock loop arrangement which (a) has an acquisition time several orders of magnitude lower than achieved with conventional phase-lock loops, (b) uses much simpler circuitry, and (c) provides locking stability against faster frequency changes than those which can be sustained using conventional circuits.

SUMMARY OF THE INVENTION

The foregoing problem has been solved in accordance with the present invention which relates to a very fast acquisition phase-lock loop arrangement and, more particularly, to a very fast acquisition second-order phase-lock loop arrangement comprising means for providing an error signal between an input signal to the loop and a voltage controlled oscillator (VCO) output signal; a network arrangement, responsive to signals from the error signal means, including a pair of diodes in a parallel front-to back arrangement shunted by a resistance of a predetermined value, which combination feeds an operational amplifier (OP-AMP); and an integrator for integrating the output signal from the OP-AMP of the network arrangement and delivering the resultant signal to the input of the VCO.

It is an aspect of the present invention to provide two appropriately tuned very fast acquisition phase-lock loop arrangements, in accordance with the present invention, in cascade for significantly improving noise performance of the overall phase-lock loop arrangement.

Other and further aspects of the present invention will become apparent during the course of the following description and by reference to the accompanying drawings.

BRIEF DESCRIPTION OF THE DRAWINGS

Referring now to the drawings in which like numerals represent like parts in the several views.

DETAILED DESCRIPTION

Figure 1:
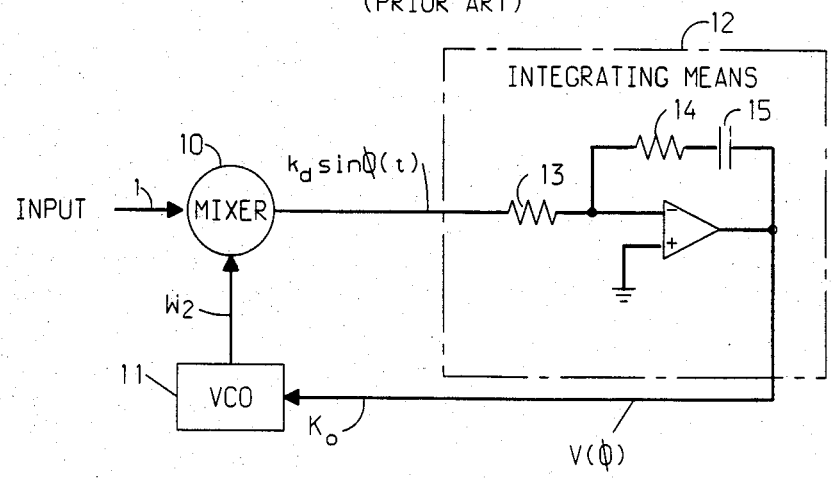
FIG. 1 is a block diagram of a conventional second-order phase-lock loop arrangement.

FIG. 1 shows a schematic of a conventional second-order phase-lock loop. In the arrangement of FIG. 1, a mixer 10 receives a first input signal to the loop at an angular frequency $\omega_1$, and a second input signal which is the output signal at an angular frequency $\omega_2$ from a voltage controlled oscillator (VCO) 11 and generates a resultant error signal therebetween which is designated by the term $k_d \sin \phi(t)$. The quantity $k_d$ depends on the amplitude of both signals and on the mixer 10 low frequency response with the value thereof expressed in volts per radian. The output from mixer 10 is integrated in integrating means 12, which is shown as using an operational amplifier (OP-AMP) but could comprise any other suitable integrating means, to generate the control signals V(φ) which tune the VCO according to the relation $$\frac{d\phi}{dt} = -k_o k_d \frac{R_2}{R_1} \sin\phi(t) - \frac{k_o k_d}{CR_1} \int_0^t \sin\phi(t)dt + \omega_2 - \omega_1. \quad (1)$$

The quantity $k_o$ defines the frequency-voltage relation of VCO 11 with its value expressed in rad/sec/volt. The quantity $\omega_2 - \omega_1$ is the initial frequency offset. The parameters $k_d$ and $k_o$ combined with the resistances 13 and 14 and the capacitance 15 of the OP-AMP define the natural loop frequency $\omega_n$ and the damping factor $\xi$ according to the relations $$\omega_n^2 = \frac{k_o k_d}{CR_1} \quad (2)$$

and $$2\xi\omega_n = k_o k_d \frac{R_2}{R_1} \quad (3)$$

Phase-locking is achieved when the charge accumulated by the capacitance 15 of the OP-AMP provides the dc voltage required to tune VCO 11 by $\omega_2 - \omega_1$, i.e., when $$\frac{\omega_2 - \omega_1}{k_o} = \frac{k_d}{CR_1} \int_0^t \sin\phi(t)dt. \quad (4)$$

For large values of $$\frac{\omega_2 - \omega_1}{\omega_n},$$

the acquisition time $t_1$ is given approximately by $$t_1 \approx \frac{1}{2\xi\omega_n} \left| \frac{\omega_2 - \omega_1}{\omega_n} \right|^2. \quad (5)$$

For example, a loop having a 200 Hz natural frequency and a damping factor of unity takes about 36 seconds to phase-lock when $$\frac{\omega_2 - \omega_1}{\omega_n} = 300.$$

ps The long duration of the acquisition process can be simply explained by noting that capacitance 15 is charged by the quasi-periodic current $k_d/R_1 \sin \phi(t)$, where $R_1$ is the value of resistance 13, whose period increases very slowly with time when $$\frac{\omega_2 - \omega_1}{\omega_n} >> 1.$$

As a result, the net charge accumulated per cycle of $\phi(t)$ is very small and it takes many such cycles to charge capacitance 15 to obtain phase-locking. For example, it would take several thousand cycles in the previously cited example.

Figure 2:
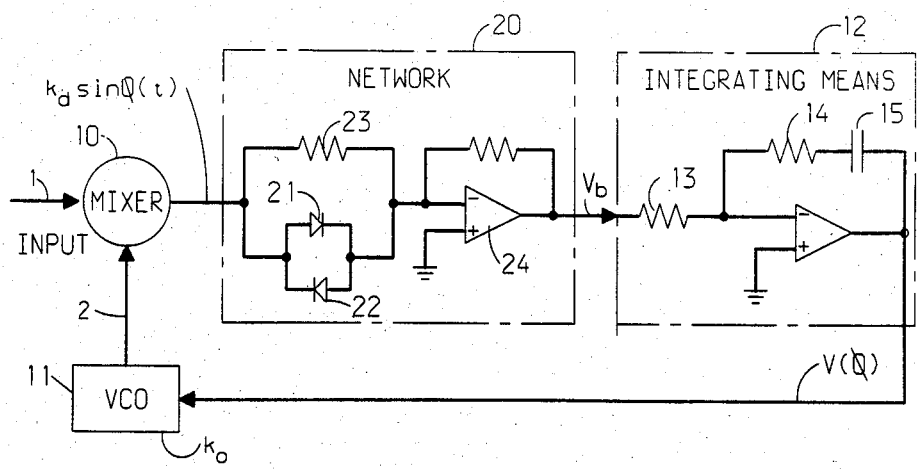
FIG. 2 is a block diagram of the phase-lock loop arrangement in accordance with the present invention.
Figure 3:
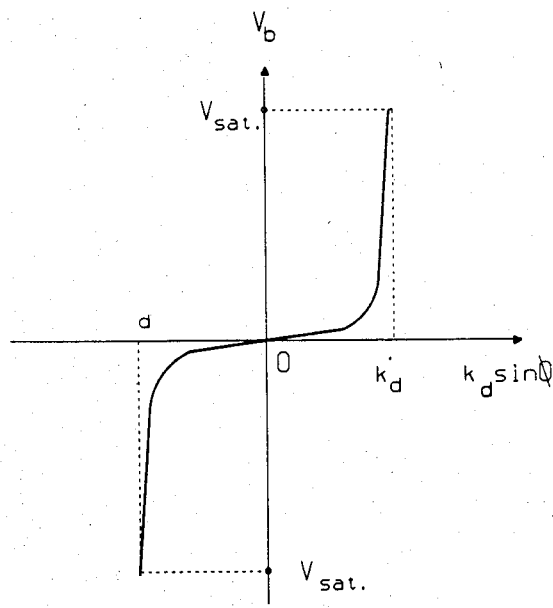
FIG. 3 illustrates a curve of the output signal of the network, in the arrangement of FIG. 1, in proportion to the phase error input signal.

In accordance with the present invention, a reduction in acquisition time is obtained by changing the error signal to the integrating means 12 for values of $\phi(t)$ close to $\pm\pi/2$. FIG. 2 is a block diagram of the second-order phase-lock loop in accordance with the present invention which modifies the arrangement of FIG. 1 by adding a network 20 between mixer 10 and integrating means 12. The network 20 comprises a pair of diodes 21 and 22 in a parallel front-to-back arrangement shunted by a resistance 23 whose value is selected to be much lower than the combined diode resistance near zero bias. The resulting network 20 subsection comprising diodes 21 and 22 and resistance 23 feeds an operational amplifier 24, whose function it is to provide an output signal, $V_b$, proportional to the network current, as illustrated in FIG. 3.

In operation, for small values of $\phi(t)$ network 20 provides the same error signal as the conventional phase-lock loop arrangement of FIG. 1, and therefore the same performance. By contrast, however, a phase error close to $\pm\pi/2$ greatly increases the magnitude of the error signal.

In this mode, the locking equation (1) can now be expressed as $$\frac{d\phi}{dt} = -k_o V_o \frac{R_2}{R_1} \sinh(\alpha k'_d \sin\phi) - \quad (6)$$

$$\frac{k_o V_o}{CR_1} \int_0^t \sinh(\alpha k'_d \sin\phi)dt + \omega_2 - \omega_1.$$

The quantities $V_o$ and $\alpha$ are parameters characterizing the diode current variation versus input signal and the gain of OP-AMP 24. The value of $k_d$ is adjusted to insure that the diode pair 21–22 is driven into conduction for a phase error close to $\pm\pi/2$ as shown in FIG. 3. The gain of OP-AMP 24 is adjusted such that $\alpha k'_d V_o = k_d$, where $k_d$ is the value in equation (2) which yields the desired loop natural frequency. The variation of the phase error $\phi(t)$ can be approximated as follows. Initially, the phase error $\phi(t)$ increases almost linearly as $(\omega_2 - \omega_1)t$. Concurrently, the current flowing in the feedback loop of the integrating means increases as $V_o/R_1 \sin h(\alpha k'_d \sin \phi)$ until the voltage developed across the resistance 14 becomes equal to the voltage required to tune VCO 11 by $\omega_2 - \omega_1$, where $R_1$ is the resistance of resistor 13. When this happens, $$\frac{\omega_2 - \omega_1}{k_o} = V_o \frac{R_2}{R_1} \sinh(\alpha k'_d \sin\phi_o), \quad (7)$$

i.e., this happens for a value of $\phi = \phi_o \leq \pi/2$ in the very short time interval $$\Delta t = \frac{\phi_o}{\omega_2 - \omega_1} \quad (8)$$

This duration is too short for any significant accumulation of charge into capacitor 15. At such point in time, $d\phi/dt = 0$ and thus VCO 11 is frequency-locked. Thereafter, the phase error $\phi(t)$ decreases to zero while the current $V_o/R_1 \sin h(\alpha k'_d \sin \phi)$ charges the capacitance 15 to give the final dc voltage $$\frac{k_o V_o}{CR_1} \int_0^{t_1'} \sinh(\alpha k'_d \sin\phi) dt$$

required to keep VCO 11 frequency tuned at $\omega_1$. This phase-locking period, following the frequency-locking time intervals $\Delta t$, lasts about $6\pi/\omega_n$ seconds, almost independently of $$\frac{\omega_2 - \omega_1}{\omega_n}.$$

Figure 4:
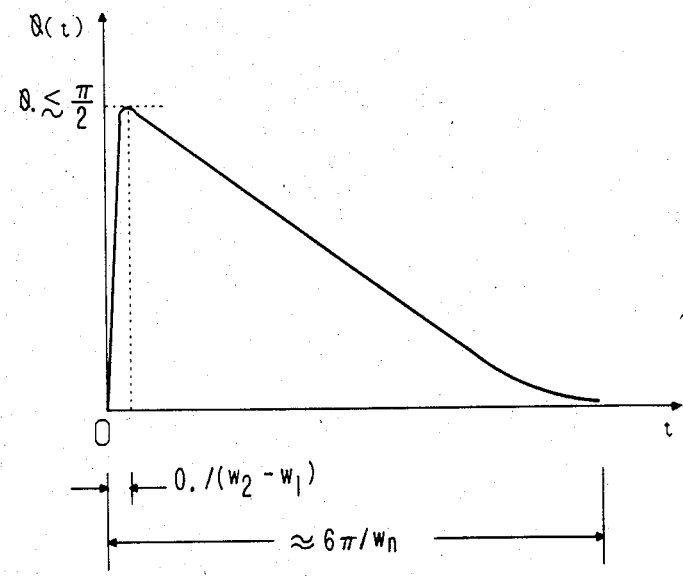
FIG. 4 illustrates a curve of the variation of the phase error over time in accordance with the arrangement of FIG. 1.

The variation of $\phi(t)$ is illustrated in FIG. 4. The maximum range of frequency acquisition is limited by $$(\omega_2 - \omega_1)_{Max} = \pm k_o \left(\frac{R_2}{R_1}\right) V_{saturation} \quad (9)$$

and by the time delay of the loop.

It should be noted that phase-locking is now achieved for a phase error variation less than $\pi/2$ instead of the many cycles needed by the conventional loop. For a damping factor of unity, the process is speeded up by a factor $$F \approx \frac{1}{12\pi}\left(\frac{\omega_2 - \omega_1}{\omega_n}\right)^2. \quad (10)$$

This gives, for $$\frac{\omega_2 - \omega_1}{\omega_n} = 300,$$

a reduction in acquisition time of about 2387. It should also be noted that for the previous loop parameters, the phase acquisition time is reduced from 36 seconds to about 15 msec, while frequency-locking is obtained in about 5 microseconds.

Once VCO 11 is phase-locked, the network 20 also provides, through the same effect, a much greater locking stability against fast frequency changes than do conventional circuits. The maximum frequency drift which can be sustained by the conventional phase-lock loop of FIG. 1 is given by $$\frac{\Delta\omega}{t_{sec}} \leq \omega_n^2 \quad (11)$$

For the arrangement of FIG. 2, this quantity increases to $$\frac{\Delta\omega}{t_{sec}} \leq \omega_n^2 \frac{V_{sat}}{k_d}, \quad (12)$$

the ratio $V_{sat}/k_d$ can be as large as 300.

In an experimental arrangement which permitted the selection of either one of the arrangements of FIGS. 1 and 2, an input signal was provided by a Hewlett Packard synthesizer generator Model 3335A, VCO 11 was provided with a Wavetek oscillator model 114 having a voltage coefficient of 200 kHz/volt around 1 MHz. Mixer 10 included a double balanced mixer giving an output of 100 mV peak to peak. The value of resistances 13 and 14 and capacitance 15 of integrating means 12 were selected to give $f_n$ approximately equal to 200 Hz and $\xi=1$ for both methods of operation. In this arrangement, the acquisition time of the conventional mode arrangement was about 35 seconds for an initial frequency offset of ±60 kHz. In the present invention mode of operation, the acquisition time was reduced to approximately 20 msec. for the same frequency offset. Concurrently, the loop of the present invention stayed locked for frequency changes which were orders of magnitude faster than those that can be sustained for the conventional mode.

Figure 5:
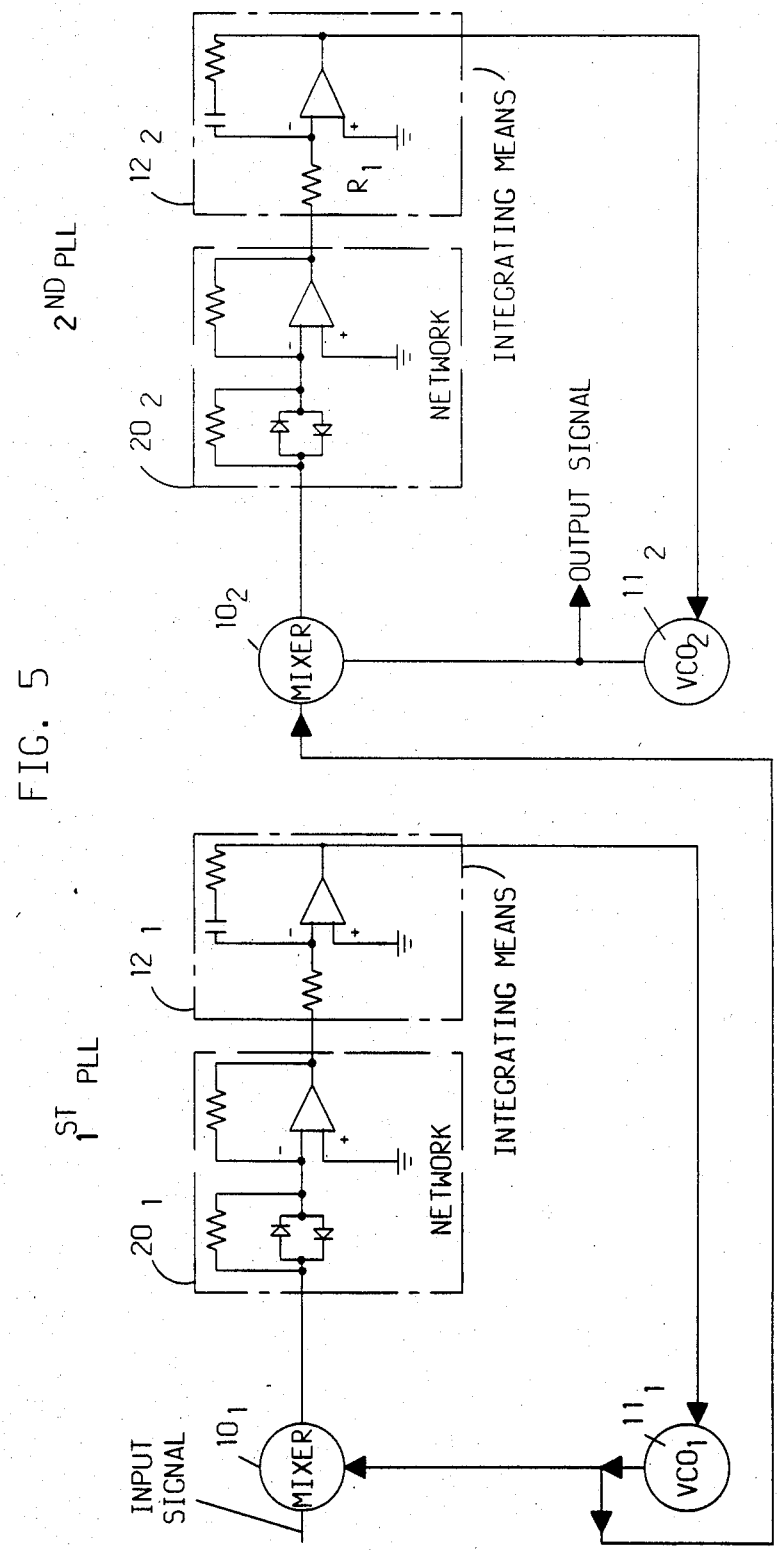
FIG. 5 illustrates a block diagram of two phase-lock loop arrangements in accordance with FIG. 2 in cascade.

If it is desired to improve the noise performance of the phase-lock loop (PLL) arrangement of FIG. 2, two arrangements as shown in FIG. 2 can be placed in cascade as shown in FIG. 5. In FIG. 5, the first PLL arrangement comprises mixer $10_1$, VCO $11_1$, network $20_1$ and integrating means $12_1$. The second PLL arrangement, in cascade with the first PLL arrangement, comprises mixer $10_2$, VCO $11_2$, network $20_2$ and integrating means $12_2$. Each PLL functions as described for the PLL of FIG. 2, but noise performance of the cascade arrangement is improved over that found with the single PLL arrangement of FIG. 2. Therefore, depending on the desired noise performance, one can use either the arrangement of FIG. 1 or the arrangement of FIG. 2.

What is claimed is:

1. A phase-lock loop arrangement comprising:
   a voltage controlled oscillator (VCO) for providing a predetermined frequency output signal in response to a predetermined input control signal;
   means responsive to both an input signal to the loop and the predetermined frequency output signal from the VCO for generating an output error signal representative of the difference in phase between the two signals;
   means capable of directly transforming the output error signal from the generating means, over a range o predetermined phase differences, into an output signal comprising a predetermined nonlinear response wherein small values of the transforming means output signal are generated which increase linearly away from zero for a small range of values of the output error signal on either side of a zero output error signal and then increase exponentially for output error signals outside said small range of values; and
   means responsive to the output signal from the transforming means for integrating the transforming means output signal and generating the input control signal to the VCO which is representative of the resultant integrated signal.

2. A phase-lock loop arrangement according to claim 1 wherein the transforming means comprises:
   a network including a pair of diodes in a parallel front-to-back arrangement shunted by a resistance whose value is lower than the diode resistance near zero bias, the network being connected to the output of the generating means; and
   an operational amplifier (OP-AMP) connected to the output of the network for generating an output signal to the integrating means which is proportional to a current propagating in the network.

3. A phase-lock loop arrangement according to claim 2 wherein the integrating means comprises an operational amplifier.

4. A phase-lock loop arrangement according to claim 1 wherein the integrating means comprises an operational amplifier.

5. A phase-lock loop arrangement according to claim 1 wherein the nonlinear response of the output signal from the transforming means essentially follows an output voltage-to-input error signal characteristic curve which resembles a sine hyperbolic characteristic curve.

6. An overall phase-lock loop arrangement comprising:
- a plurality of phase-lock loops arranged in cascade between an input and an output of the overall arrangement, each phase-lock loop (PLL) comprising:
- an input terminal for receiving either (1) an input signal to the overall PLL arrangement if the associated PLL is a first PLL in the cascade arrangement, or (2) an output signal from the immediately prior PLL in the cascade arrangement if the PLL is not a first PLL in the cascade arrangement;
- an output terminal for delivering an output signal from the associated PLL to either (1) an output of the overall phase-lock loop arrangement if the associated PLL is the last PLL in the cascade arrangement, or (2) an input of a next subsequent PLL in the cascade arrangement if the PLL is not a last PLL in the cascade arrangement;
- a voltage controlled oscillator (VCO) for providing a predetermined frequency output signal to the output terminal of the associated PLL in response to a predetermined input control signal;
- means, responsive to both an input signal from the input terminal of the associated PLL, and the predetermined frequency output signal from the associated VCO, for generating an output error signal representative of the difference in phase between the PLL input signal and the VCO output signal;
- means capable of directly transforming the output error signal from the generating means, over a possible range of predetermined phase differences, into an output signal comprising a predetermined nonlinear response wherein small values of the transforming means output signal are generated which vary linearly away from zero for a small range of values of the output error signal on either side of a zero output error signal and then increase exponentially for output error signals outside said small range of values; and
- means responsive to the output signal from the transforming means for integrating the transforming means output signal and generating a control signal to the VCO representative of the resultant integrated signal.

7. A phase-lock arrangement according to claim 6 wherein the transforming means comprises:
- a network including a pair of diodes in a parallel front-to-back arrangement shunted by a resistance whose value is lower than the diode resistance near zero bias, the network being connected to the output of the generating means; and
- an operational amplifier (OP-AMP) connected to the output of the network for generating an output signal to the integrating means which is proportional to a current propagating in the network.

8. A phase-lock loop arrangement according to claim 7 wherein the integrating means comprises an operational amplifier.

9. A phase-lock loop arrangement according to claim 6 wherein the integrating means comprises an operational amplifier.

10. A phase-lock arrangement according to claim 6 wherein the nonlinear response of the output signal from the transforming means essentially follows an output voltage-to-input error signal characteristic curve which resembles a sine hyperbolic characteristic curve.

* * * * *